(12) United States Patent
Patti et al.

(10) Patent No.: US 9,496,392 B2
(45) Date of Patent: *Nov. 15, 2016

(54) INTEGRATED VACUUM MICROELECTRONIC STRUCTURE AND MANUFACTURING METHOD THEREOF

(71) Applicant: STMICROELECTRONICS S.R.L., Agrate Brianza (IT)

(72) Inventors: Davide Giuseppe Patti, Mascalucia (IT); Gianleonardo Grasso, Giarre (IT)

(73) Assignee: STMICROELECTRONICS S.R.L., Agrate Brianza (IT)

( * ) Notice: Subject to any disclaimer, the term of this patent is extended or adjusted under 35 U.S.C. 154(b) by 0 days.

This patent is subject to a terminal disclaimer.

(21) Appl. No.: 14/667,215

(22) Filed: Mar. 24, 2015

(65) Prior Publication Data

US 2015/0279988 A1    Oct. 1, 2015

(30) Foreign Application Priority Data

Mar. 31, 2014  (IT) .............................. MI2014A0552

(51) Int. Cl.
*H01L 29/76* (2006.01)
*H01L 29/94* (2006.01)
(Continued)

(52) U.S. Cl.
CPC ............. *H01L 29/7827* (2013.01); *G01K 7/01* (2013.01); *H01J 21/10* (2013.01); *H01L 29/12* (2013.01); *H01L 29/66969* (2013.01)

(58) Field of Classification Search
CPC .................... H01L 29/7827; H01L 29/66666; H01L 29/8083

USPC ........................................................... 257/329
See application file for complete search history.

(56) References Cited

U.S. PATENT DOCUMENTS 5,163,328 A     11/1992 Holland et al.
5,249,340 A *  10/1993 Kane ..................... H01J 21/105
                                                                216/11
(Continued)

FOREIGN PATENT DOCUMENTS

CN          1327610 A       12/2001
DE      41 12 436 A1       11/1992
(Continued)

OTHER PUBLICATIONS

Chinese Search Report, dated Aug. 22, 2016, for Chinese Application No. 2014102417457, 2 pages.

*Primary Examiner* — Theresa T Doan
(74) *Attorney, Agent, or Firm* — Seed IP Law Group LLP (57) ABSTRACT

An integrated vacuum microelectronic structure is described as having a highly doped semiconductor substrate, a first insulating layer placed above said doped semiconductor substrate, a first conductive layer placed above said first insulating layer, a second insulating layer placed above said first conductive layer, a vacuum trench formed within said first and second insulating layers and extending to the highly doped semiconductor substrate, a second conductive layer placed above said vacuum trench and acting as a cathode, a third metal layer placed under said highly doped semiconductor substrate and acting as an anode, said second conductive layer is placed adjacent to the upper edge of said vacuum trench, the first conductive layer is separated from said vacuum trench by portions of said second insulating layer and is in electrical contact with said second conductive layer.

19 Claims, 8 Drawing Sheets

(51) Int. Cl.
  *H01L 29/78* (2006.01)
  *H01L 29/12* (2006.01)
  *H01L 29/66* (2006.01)
  *H01J 21/10* (2006.01)
  *G01K 7/01* (2006.01)

(56) References Cited

U.S. PATENT DOCUMENTS

| | | | |
|---|---|---|---|
| 5,358,909 A * | 10/1994 | Hashiguchi | H01J 9/025 216/11 |
| 5,463,269 A | 10/1995 | Zimmerman | |
| 5,603,649 A | 2/1997 | Zimmerman | |
| 5,795,208 A | 8/1998 | Hattori | |
| 6,252,340 B1 * | 6/2001 | Hattori | H01J 9/025 313/309 |
| 2001/0010649 A1 | 8/2001 | Lu | |
| 2014/0353576 A1 * | 12/2014 | Patti | H01J 21/105 257/10 |

FOREIGN PATENT DOCUMENTS

| | | |
|---|---|---|
| DE | 42 24 519 A1 | 1/1994 |
| EP | 0 501 785 A2 | 4/2016 |

* cited by examiner

Fig.13 ial Field
The present disclosure relates to an integrated vacuum microelectronic structure and manufacturing method thereof.

2. Description of the Related Art

The vacuum tube, once one of the mainstays of electronics, had limitations such as the mechanically fabricated structure inside the glass envelope, preventing miniaturization and integration. For this reason, in the era of systems on chip, it has been gradually supplanted by transistors.

However, in the last year semiconductor manufacturing techniques have been used to develop vacuum tube structures in micro miniature form and integrate many of them together. The integrated Vacuum Microelectronic Devices (VMD) have several unique features; they have sub picosecond switching speeds, operate at temperature ranging from near absolute zero to hundreds of degrees Celsius, are also very efficient because control is by charge and not by current flow and thermionic emission heaters are not included, like in the traditional vacuum discrete devices.

In summary a typical field emission VMD device is made up of a sharply pointed cathode, surrounded by one or more control and/or extraction electrode, and pointing toward an anode surface. When an appropriate positive potential difference is applied between the cathode and the control electrode, an electric field is generated at the cathode that allows electrons to tunnel through a vacuum space and move towards the anode. The field at the cathode, and hence, the quantity of electrons emitted, can be controlled by varying the control electrode potential.

U.S. Pat. No. 5,463,269 discloses an integrated VMD device and a method for making thereof. The integrated VMD device is performed by using a manufacturing process in which the conformal deposition of an insulator into a trench produces a symmetric cusp that can be used as a mold to form a pointed or sharp field emission tip. The trench can be created out of any stable material including layered alternating stacks of conductors and insulators which can act as the electrodes of the finished devices. Two electrodes (anode and emitter) form a simple diode while three, four and five electrodes would form respectively a triode, tetrode, and pentode for example. Since the cusp is self-aligned within the center of the trench it is also aligned to the center of these electrodes. The cusp is then filled with a material capable of emitting electrons under the influence of an electric field or an electron-emitting material.

An access trench created in the electron-emitting material allows the removal of the insulator of the cusp forming layer from the trench and from underneath the emitter material, thus forming a space and freeing the sharp tip of the emitter (field emission cathode) that was molded by the cusp.

However, the realization of the above described Vacuum Microelectronic Device involves high process flow cost and, nevertheless, said VMD could be affected by some problems which may alter the operative features such ionizing radiations and noise at the power output.

BRIEF SUMMARY

One aspect of the present disclosure is to provide an integrated vacuum microelectronic structure which is different from the known structures.

One aspect of the present disclosure is an integrated vacuum microelectronic structure that includes a highly doped semiconductor substrate, a first insulating layer placed above said doped semiconductor substrate, a first conductive layer placed above said first insulating layer, a second insulating layer placed above said first conductive layer, a vacuum trench formed within said first and second insulating layers and extending to the highly doped semiconductor substrate, a second conductive layer placed above said vacuum trench and acting as a cathode, a third conductive layer placed under said highly doped semiconductor substrate and acting as an anode, said second conductive layer being placed adjacent to the upper edge of said vacuum trench, wherein the first conductive layer is separated from said vacuum trench by portions of said second insulating layer and is in electrical contact with said second conductive layer.

BRIEF DESCRIPTION OF THE SEVERAL VIEWS OF THE DRAWINGS

For a better understanding of the present disclosure, an embodiment thereof is now described, purely by way of non-limiting example and with reference to the annexed drawings, wherein.

DETAILED DESCRIPTION

Figure 1:
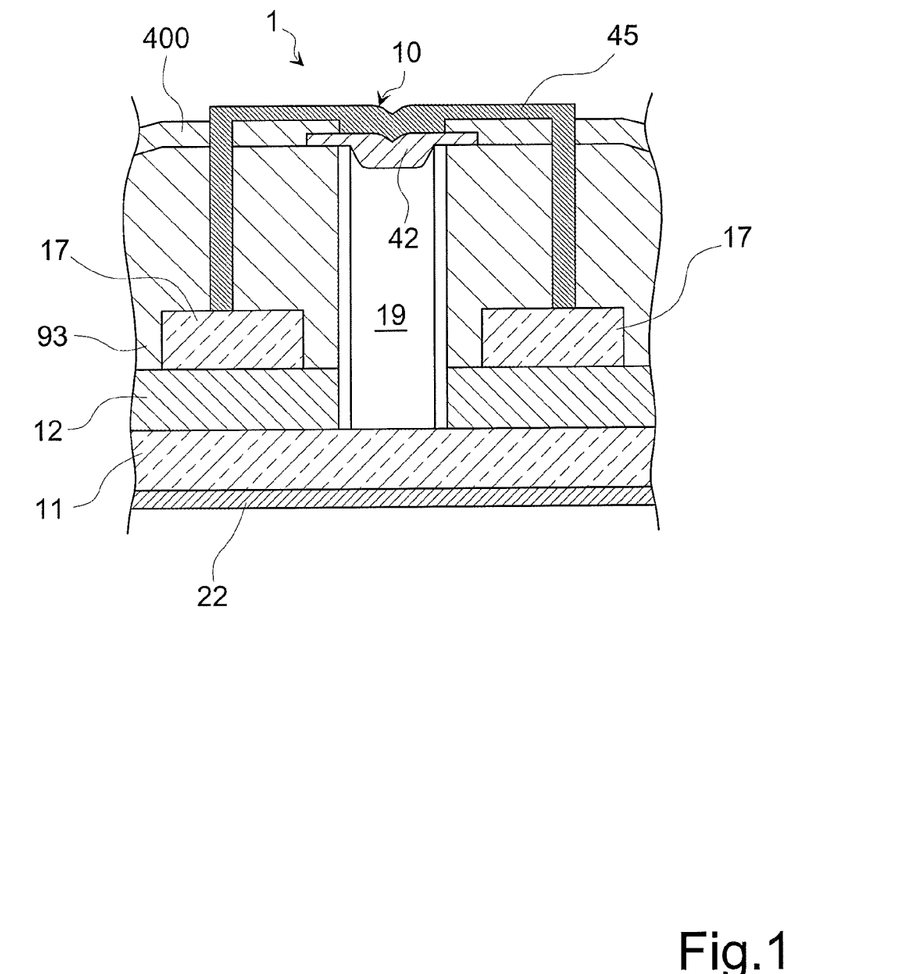
FIG. 1 is a cross-sectional view of a vacuum microelectronic structure according to a first embodiment of the present disclosure.
Figure 3:
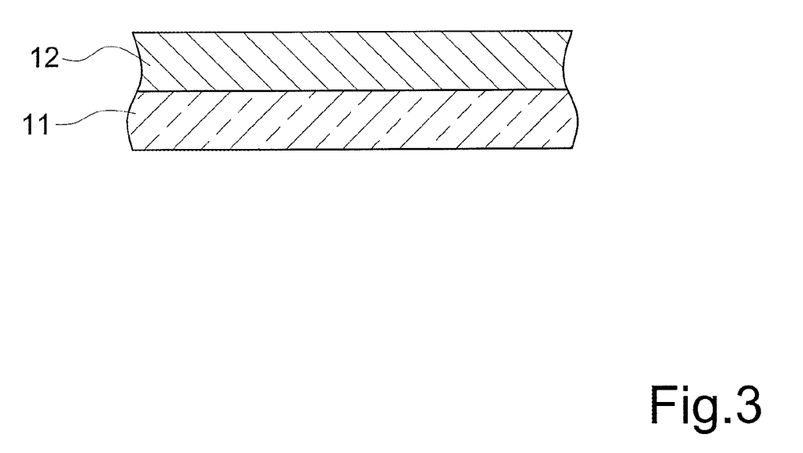
FIG. 3-12 are cross-sectional views of the different process steps to form the vacuum microelectronic structure according to the first embodiment of the present disclosure.

FIG. 1 illustrates a cross-sectional view of a vacuum microelectronic structure 1 according to a first embodiment of the present disclosure and FIGS. 3-12 show the different steps for the manufacturing of the above vacuum microelectronic structure 1. The vacuum microelectronic structure 1 is a vacuum microelectronic device comprising at least a sharp emitter (cathode) tip, a collector (anode) with an insulator separating the emitter and the collector and wherein there is a preferably direct transmission of electrons from the emitter to the collector. The vacuum microelectronic structure 1 is formed on a semiconductor substrate 11, which is a highly doped semiconductor substrate 11 according to one embodiment, above which a first insulating layer 12 of a suitable thickness as to sustain a maximum operating voltage is formed (FIG. 3). The semiconductor substrate 11 is a highly doped n-type semiconductor substrate in one embodiment where the material used for doping the semiconductor substrate 11 is phosphorous and the resistivity of the semiconductor substrate 11 is about 4 mOhm×cm, the thickness being between 600 to 800 micrometers. The insulating layer 12 can be a silicon-dioxide ($SiO_2$) layer.

Other materials that are equally acceptable for the doped semiconductor substrate 11 or the at least one insulating layer 12 could be used and any suitable method of layer formation as are generally practiced throughout the semiconductor industry could be adopted.

Preferably, the insulating layer 12 is formed by means of a known thermal process controlled in temperature (typically comprised between 400° C. and 600° C.) like, for example, a PECVD deposition (plasma-enhanced chemical vapor deposition).

Figure 4:
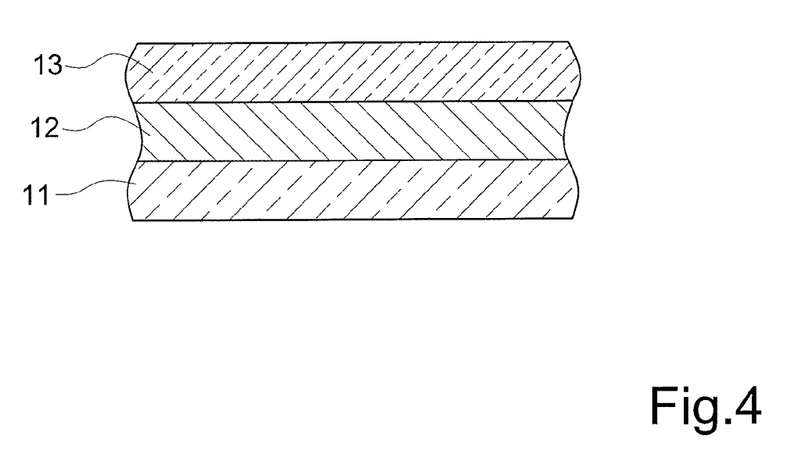

A first conductive layer 13, which could be doped polysilicon, is then deposited on the first insulating layer 12 (FIG. 4). The polysilicon layer 13 is doped with a dopant having a concentration higher than $10^{18}$ atoms/cm$^3$; preferably the doping of the polysilicon layer 13 is effectuated when it is deposited on the first insulating layer 12 or successively by dopant ionic implant. The thickness of conductive layer 13 is suitable to effectuate the shield action of the electric field which is present in the structure when the operating voltage is applied thereto, typically an operating voltage up to 1 Volt over the voltage threshold; the thickness of conductive layer 13 is preferably about 0.3 micrometers. Said conductive layer 13 is preferably deposited through LTCVD deposition (low-temperature chemical vapor deposition). However, other suitable conductive electric material could be used to form the layer 13.

Figure 5:
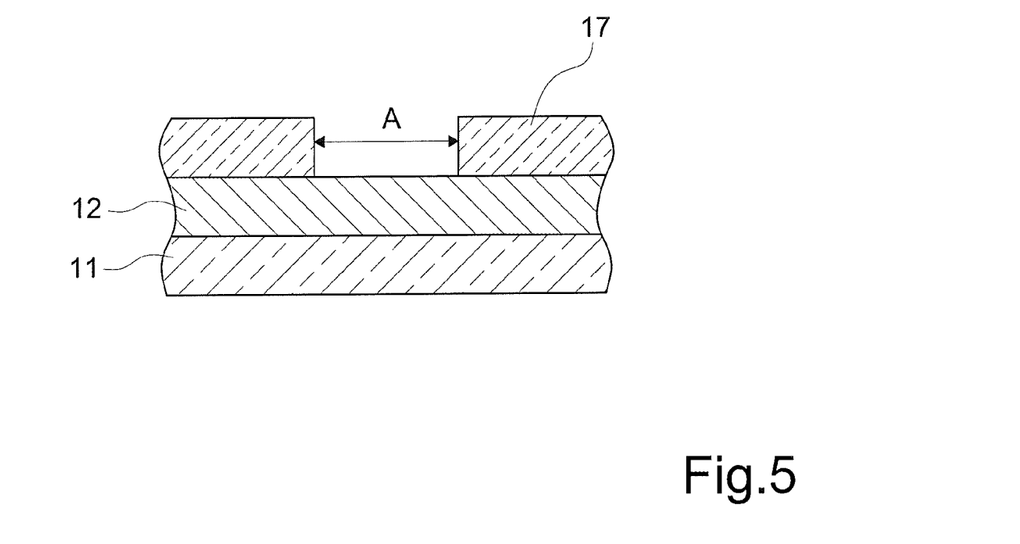

A first conductor 17 is then defined from the conductive layer 13 as is shown in FIG. 5; this is obtained by placing a lithographic mask over the conductive layer 13 and successively effectuating an anisotropic etching. The conductive layer 13 is patterned for obtaining the annular shaped first conductor 17, preferably a toroid shaped structure, of conductive layer 13 with an internal diameter A, for example from 1 to 4 micrometers.

Figure 6:
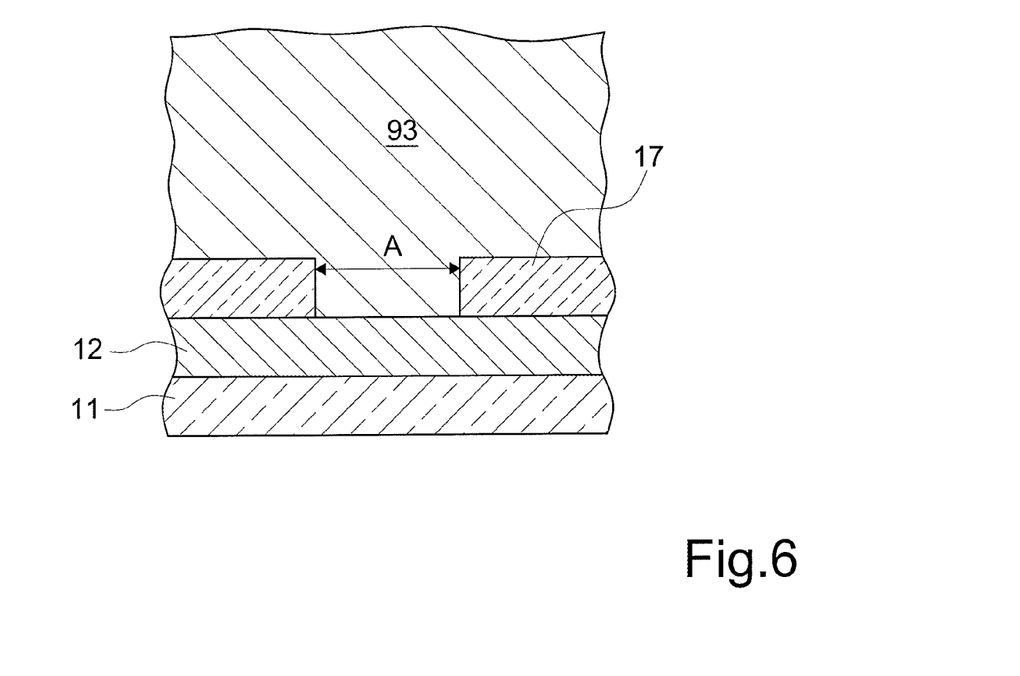

In the next step, an insulating layer 93 is grown above the first conductor 17 (FIG. 6). Any material which has electrical insulation properties could be used for the insulating layer 93, like, for example a silicon-dioxide (SiO$_2$). Preferably, a PECVD deposition is used even if any low temperature techniques could be adopted.

Figure 7:
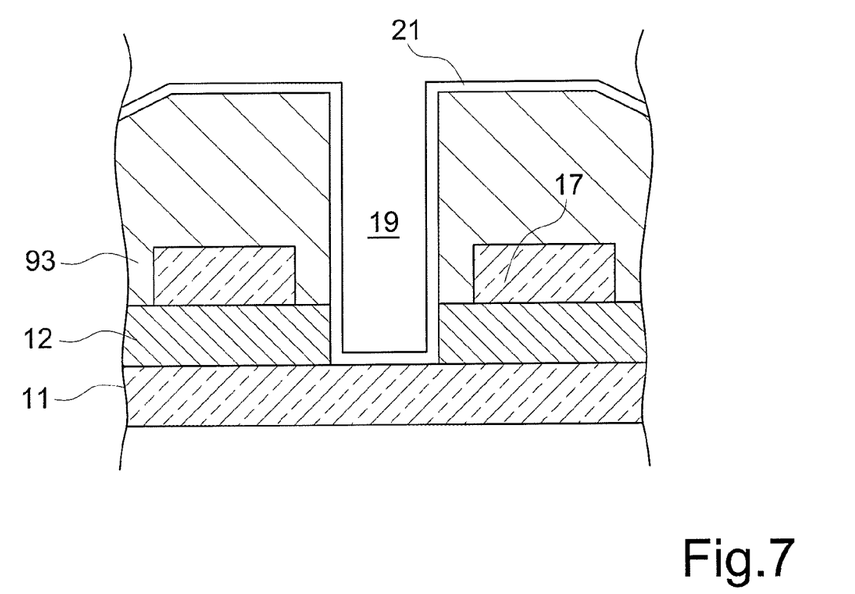

Since the deposition of the insulating layer 93, a vacuum trench or space 19 is formed within said insulating layers 12 and 93 inside the area limited by the toroid shape structure of the first conductor 17 (FIG. 7). The vacuum space 19 is formed by means of a lithographic mask over the insulating layer 93 and successively effectuating an anisotropic etching on the insulating layers 12, 93 for removing the insulating material of the layers 12, 93 where the vacuum trench is to be formed; the anisotropic etching is effectuated until the upper surface of the doped semiconductor substrate 11 is exposed. The shape of the vacuum trench 19 can be square, round, oval, etc. Preferably, the dimension of the width W of the vacuum trench 19 range from 0.3 micrometers to 0.6 micrometers.

Preferably the formation of the vacuum trench or space 19 provides the formation of a masking layer that is sensitive in a positive or negative sense to some form of actinic radiation is deposited on the surface of interest and successively this layer is exposed patternwise to the appropriate actinic radiation to selectively remove the masking layer and expose the underlying surface in the patterns selected; then the exposure surface is anisotropic etched to remove all or part of the underlying material as selected and then the remaining areas of the masking layer are removed.

Preferably a second insulating layer 21 of a low thickness (typically ranging from 50 nm to 100 nm) is then in conformal mode deposited over the previously realized structure, to cover even the internal walls of the vacuum space 19 (FIG. 7). Preferably, the second insulating layer 21 could be a silicon-nitride (Si$_3$N$_4$) which can be formed, through known methods which ensure a layer thickness homogeneous in all the directions like, for example, to a PECVD deposition.

Figure 8:
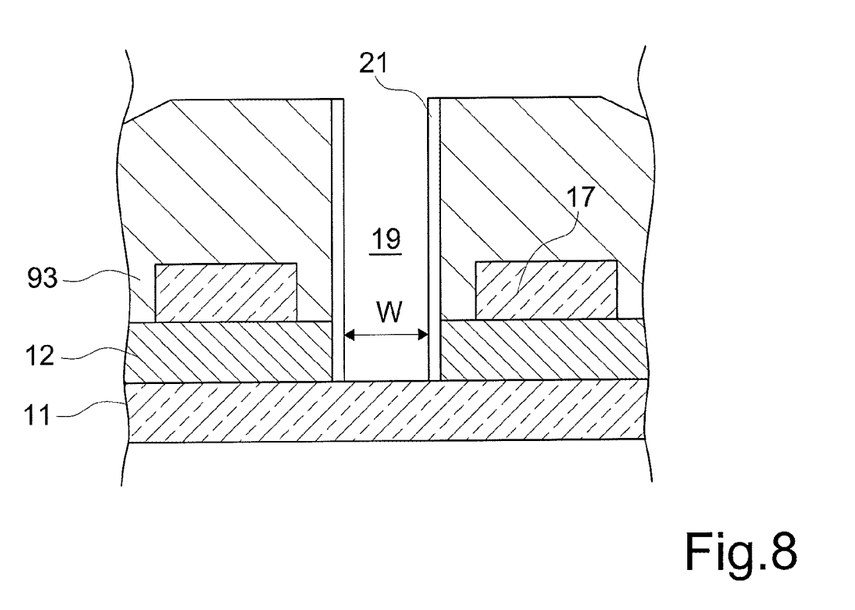

The second insulating layer 21 is then defined leaving the second insulating layer 21 only on the sidewalls of the vacuum space 19 (FIG. 8). Advantageously, the selective etching is a dry select or anisotropic etching with no masks usage.

Figure 9:
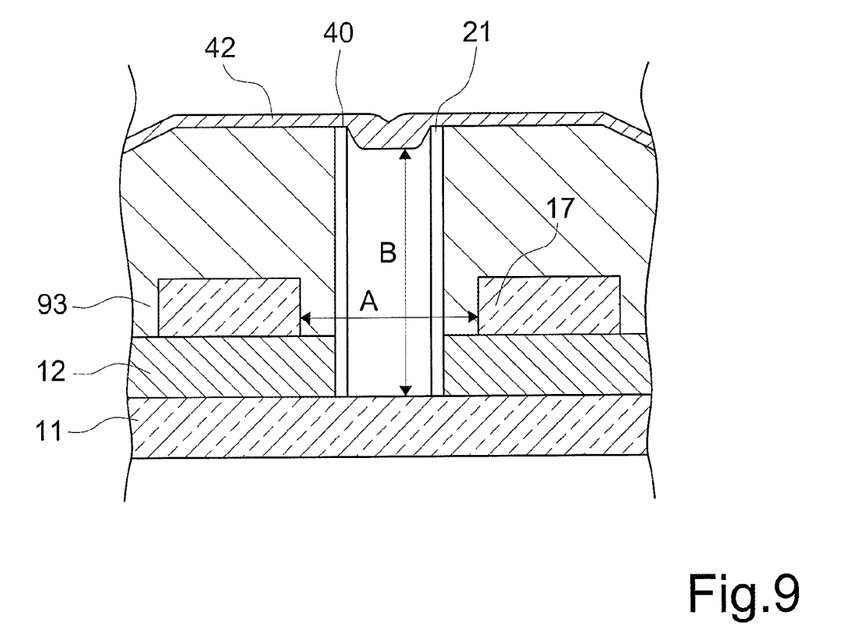

A non-conformal deposition of a second conductive layer 42, preferably a metal layer, over the previously realized structure closes the vacuum trench 19 (FIG. 9). Preferably the second conductive layer 42 is deposited at low temperature, typically lower than 300° C., so that the speed of deposition is not homogeneous in all the directions, but the horizontal direction is privileged. The second conductive layer 42 is placed adjacent to an upper edge 40 of the vacuum trench 19, preferably adjacent to the upper edge of the upper opening of the vacuum trench 19, forming protuberances from said upper edge 40 which, growing mostly along the horizontal direction, approach towards the inside of the vacuum trench, remaining suspended over said vacuum trench 19, and unite themselves at the end of the deposition step. Said vacuum trench 19 has a width dimension W such as the second conductive layer 42 remains suspended over said vacuum trench 19; the second conductive layer 42 allows sealing the vacuum trench 19.

The upper edge 40 refers to the edge of the opening of the vacuum trench 19 which is opened in the upper surface of said insulating layer 93. The depth B of the vacuum space 19 depends on the thickness of the insulating layers 12, 93 while the dimension of the width W of the vacuum space 19, that is the dimension of the cross-section of the vacuum space 19, is suitable to avoid a precipitation of the second conductive layer 42 inside the vacuum trench 19. Preferably the thickness of the second conductive layer 42 is suitable to produce a sealing cap; preferably, the thickness of the second conductive layer 42 is equal to at least the width W of the vacuum trench 19 and, in any case, lower than 1 µm. The depth or distance B determines the maximum operating voltage of the vacuum microelectronic structure 1 according to the present disclosure.

The diameter A of the toroid shaped first conductor 17 determines the emission threshold of the vacuum microelectronic structure 1; an increase of the diameter A causes a decrease of the emission threshold of the vacuum microelectronic structure 1.

A RF sputtering deposition technique is typically used for the formation of the second conductive layer 42, but other processes can produce acceptable results.

Since said second conductive layer 42 is the last deposition conduced in a vacuum environment, preferably a high vacuum environment, the vacuum trench 19 will have for example a vacuum pressure of about $10^{-5}$ Torr or $1.33 \times 10^{-3}$ Pascal, preferably the pressure at the deposition step of the second conductive layer 42.

Figure 10:
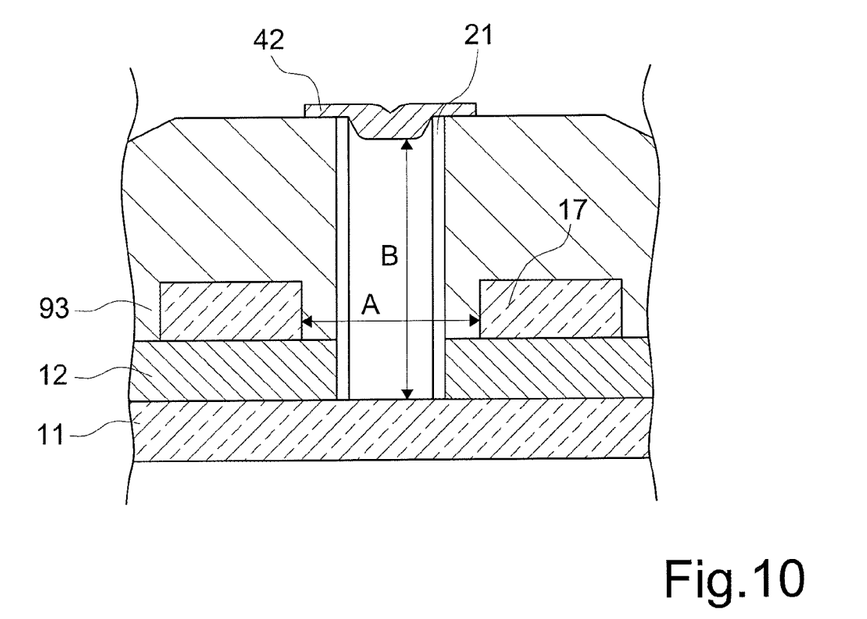
Figure 11:
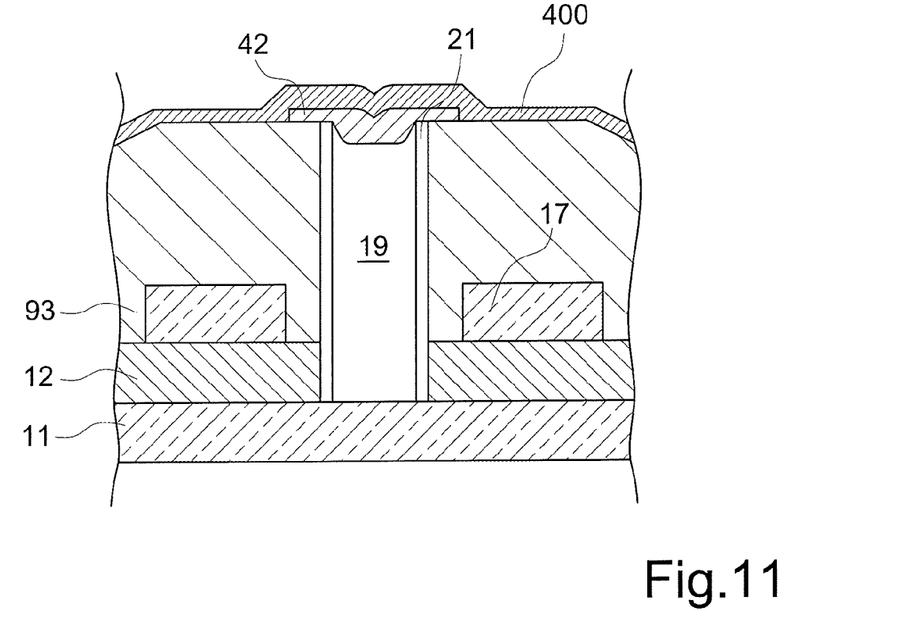
Figure 12:
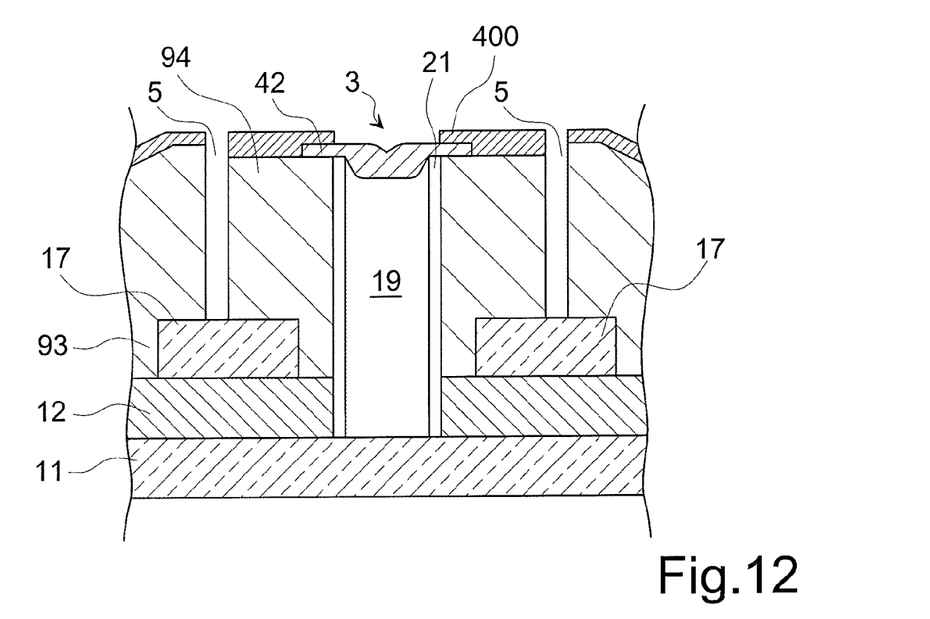

The second conductive layer 42 is then lithographically defined, leaving only a suitable central portion which continue to ensure the sealing of the vacuum trench 19 (FIG. 10).

The second conductive layer 42, being an electron-emitting layer, will act as a cathode during the operation of the vacuum microelectronic structure 1.

A cathode passivation is then performed through a deposition process of a further insulating layer 400, preferably a deposition process of the PECVD type. However, any suitable passivation techniques could be adopted, as similarly discussed in the previous process steps.

Openings 3 and 5 are then arranged in the insulating layer 400 and in the insulating layer 93, until the respective portions of the upper face of the first conductive layer 13 and of the toroid shape first conductor 17 are exposed. Said openings are suitable for forming the cathode contact 10 to allow the electrical connection from the top of the finished structure 1.

To this purpose a further metal layer 45 is deposited over the now realized structure and in the opening 3, 5 to fully fill the openings 3, 5. Preferably the further metal layer is aluminum or a combination of copper and aluminum.

The cathode contact 10 is lithographically defined from said further metal layer; the second conductive layer 42 is placed in contact with the toroid shaped first conductor 17 by means of the metal layer 45.

Figure 2:
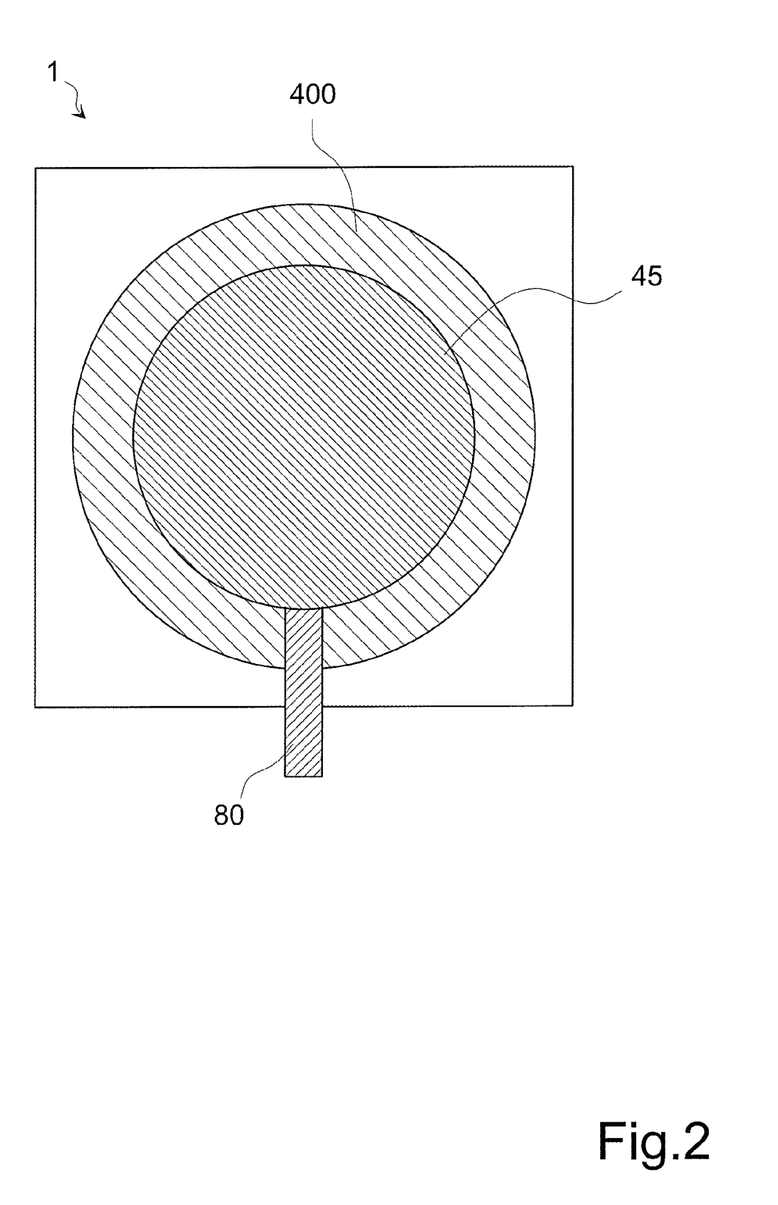
FIG. 2 shows schematically a layout of a vacuum microelectronic structure according to the first embodiment of the present disclosure.

A back further conductive layer 22 (Aluminum or a succession of layer of Titanium, Nickel, Aluminum, for example) is placed under the highly doped semiconductor substrate 11 to form the anode. Preferably, the back finishing is performed by a grinding and evaporation process. A metal path 80 is formed for contacting the metal layer 45, as shown in the layout of the integrated vacuum microelectronic structure in FIG. 2.

When an appropriate difference of potential is applied between the electrodes connected to the metal layer 45 and the further conductive layer 22 (with a positive potential applied at the electrode connected with the metal layer 45), the cathode allows electrons to tunnel through the vacuum space 19 and move towards the highly doped substrate material 11 and the further conductive layer 22.

The vacuum microelectronic structure 1 of the first embodiment of the present disclosure performs a field emission vacuum electronic diode the operating voltage of which depends on the temperature. By biasing the structure 1 with a constant current the voltage across the diode can be monitored which is inversely proportional to the temperature at which the structure 1 is submitted. The vacuum microelectronic structure 1 of the present disclosure may be used for any apparatus that operate at high temperature, more than 200° C. but lower than 400° if the layer 42 is Aluminum, or in general lower than maximum package allowed temperature. A current of about 1 microampere may be flowed through the vacuum microelectronic structure 1 in the case of use of the structure as electronic thermometer.

Figure 13:
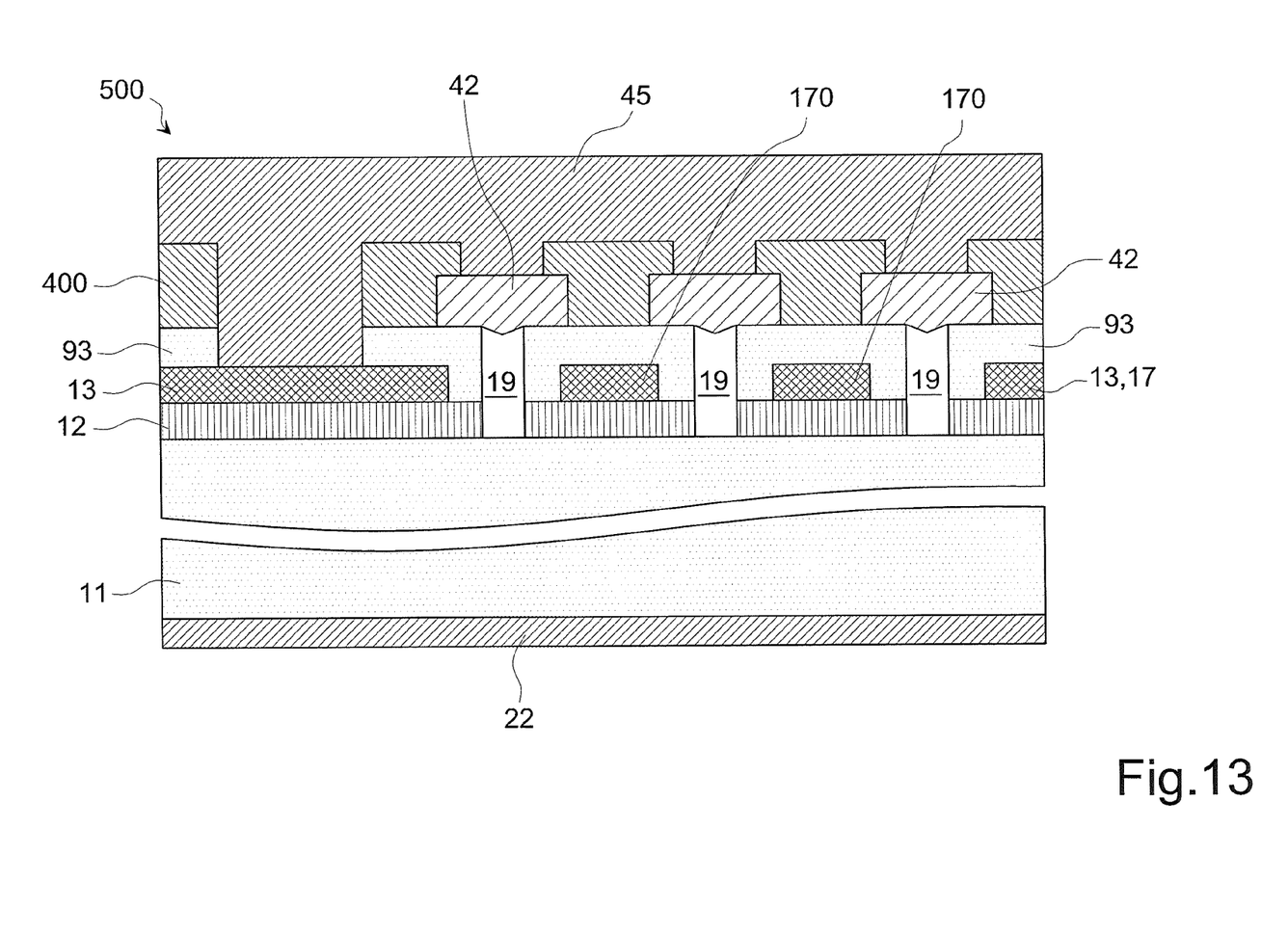
FIG. 13 is a cross-sectional view of an integrated device according to a second embodiment of the present disclosure.

An integrated device 500 (FIG. 13) comprising a plurality of vacuum microelectronic structure 1 may be formed according to a second embodiment of the present disclosure wherein the vacuum microelectronic structures 1 of the first embodiment of the present disclosure are arranged in parallel to each other. Preferably the annular shape conductive structures 17, preferably toroid shape conductive structures 17, of two adjacent vacuum microelectronic structures 1 of the plurality of vacuum microelectronic structure 1 have a ring part or toroid part in common. FIG. 13 shows then integrated device 500 comprising three vacuum microelectronic structures 1; the two ring parts or toroid parts in common of the three annular shape conductive structures 17 of the three vacuum microelectronic structures 1 are indicated by the reference 170.

The integrated device 500 of the second embodiment of the present disclosure performs a field emission vacuum electronic diode the operating voltage of which depends on the temperature. By biasing the integrated device 500 with a constant current the voltage across the device can be monitored which is inversely proportional to the temperature at which the integrated device 500 is submitted. The integrated device 500 may be used for any apparatus that operate at high temperature. A current higher than 1 microampere, but preferably comprises between 1 microampere and 100 microampere, may be flowed through the integrated device 500 in the case of use of the integrated device 500 as electronic thermometer; the integrated device 500 may support a higher current than a single vacuum microelectronic structure 1.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An integrated vacuum microelectronic structure, comprising:
   a highly doped semiconductor substrate;
   a first insulating layer positioned on a first side of the highly doped semiconductor substrate;
   a first conductive layer positioned on the first insulating layer;
   a second insulating layer positioned on the first conductive layer;
   a vacuum trench formed in the first and second insulating layers and extending to the highly doped semiconductor substrate;
   a second conductive layer positioned over the vacuum trench and configured to be a cathode;
   a third conductive layer positioned on a second side of the highly doped semiconductor substrate and configured to be an anode; and
   a fourth conductive layer having a first portion positioned over the second conductive layer and a second portion extending from the second conductive layer through the second insulating layer to the first conductive layer, said second conductive layer is positioned adjacent to an upper edge of the vacuum trench, the first conductive layer is separated from the vacuum trench by portions of the second insulating layer.

2. The integrated vacuum microelectronic structure according to claim 1 wherein said vacuum trench has a width, the second conductive layer being suspended over said vacuum trench, across the width.

3. The integrated vacuum microelectronic structure according to claim 1 wherein said vacuum trench includes a third insulating layer on sidewalls of the vacuum trench.

4. The integrated vacuum microelectronic structure according to claim 1 wherein said first conductive layer is made of doped polysilicon, having a dopant concentration higher than $10^{18}$ atoms/cm$^3$.

5. The integrated vacuum microelectronic structure according to claim 1 wherein said vacuum trench has a width in the range of 0.3 micrometers and 0.6 micrometers.

6. The integrated vacuum microelectronic structure according to claim 1 wherein said first conductive layer has a ring shape structure, said vacuum trench being formed inside a hole of said ring shape structure.

7. The integrated vacuum microelectronic structure according to claim 6 wherein a depth of the vacuum trench depends on a thickness of the first and the second insulating layers and a threshold voltage of the integrated vacuum microelectronic structure depends on a diameter of the ring shape structure.

8. The integrated vacuum microelectronic structure according to claim 6 wherein said ring shape structure is a toroid shape structure.

9. The integrated vacuum microelectronic structure according to claim 6 wherein said ring shape structure has an internal diameter in the range of 1 micrometer and 4 micrometers.

10. An integrated device, comprising:
a plurality of vacuum microelectronic structures arranged in parallel to each other, each microelectronic structure including:
a highly doped semiconductor substrate;
a first insulating layer positioned on a first side of the highly doped semiconductor substrate;
a first conductive layer positioned on the first insulating layer;
a second insulating layer positioned on the first conductive layer;
a vacuum trench formed in the first and second insulating layers and extending to the highly doped semiconductor substrate;
a second conductive layer positioned over the vacuum trench and configured to be a cathode;
a third insulating layer positioned over the second insulating layer and the second conductive layer, the third insulating layer having an opening exposing the second conductive layer;
a third conductive layer formed in the opening; and
a fourth conductive layer positioned on a second side of the highly doped semiconductor substrate and configured to be an anode, said second conductive layer is positioned adjacent to an upper edge of the vacuum trench, the first conductive layer is separated from the vacuum trench by portions of the second insulating layer and is in electrical contact with the second conductive layer.

11. The integrated device of claim 10 wherein the fourth conductive layer is formed as a plurality of interlocking ring structures, each vacuum trench being formed in a hole in a respective one of the plurality of interlocking ring structures.

12. A device, comprising:
a substrate;
a first conductive structure formed on a first surface of the substrate;
a vacuum trench formed between portions of the first conductive structure, a first end of the vacuum trench in contact with the substrate;
a second conductive structure on a second end of the vacuum trench, the second conductive structure being configured to seal the vacuum trench, the second conductive structure being a cathode;
a third conductive structure that electrically couples the first conductive structure to the second conductive structure, the third conductive structure having a first portion separated from the second end of the vacuum trench by the second conductive structure and a second portion lateral to sidewalls of the vacuum trench; and
a fourth conductive structure on a second surface of the substrate, the fourth conductive structure being an anode.

13. The device of claim 12, further comprising a first insulating layer between the substrate and the first conductive structure, the vacuum trench extending through the first insulating layer and a second insulating layer on top and side surfaces of the first conductive structure, the second insulating layer separating the vacuum trench from the first conductive structure.

14. The device of claim 13 wherein the first conductive structure includes a central portion that extends into the vacuum trench and distal portion that is in contact with the second insulating layer.

15. A device, comprising:
a substrate including:
a first surface; and
a second surface opposite to the first surface;
an anode on the first surface of the substrate;
a first insulating layer on the second surface of the substrate;
a first conductive layer on the first insulating layer;
a second insulating layer on the first insulating layer and the first conductive layer;
a trench formed in the first insulating layer and the second insulating layer, the trench having an opening adjacent to the second insulating layer;
a cathode positioned on the opening of the trench; and
a second conductive layer including:
a first portion over the cathode and the second insulating layer; and
a second portion that extends through the second insulating layer and contacts the first conductive layer, the second portion and the first conductive layer being separated from the sidewalls of the trench by the second insulating layer.

16. The device of claim 15, further comprising a third insulating layer over the cathode and the second insulating layer, the third insulating layer having an opening that exposes the cathode.

17. The device of claim 16, wherein the second conductive layer is formed over the third insulating layer and in the opening of the third insulating layer.

18. The device of claim 15, wherein the first portion extends in a first direction that is substantially parallel to the second surface of the substrate, and the second portion extends in a second direction that is substantially perpendicular to the second surface of the substrate.

19. The device of claim 15, further comprising a third insulating layer on sidewalls of the trench.

* * * * *